United States Patent [19]

Noda

[11] Patent Number: 5,030,589
[45] Date of Patent: Jul. 9, 1991

[54] PRODUCTION METHOD FOR A SEMICONDUCTOR DEVICE

[75] Inventor: Minoru Noda, Itami, Japan

[73] Assignee: Mitsubishi Denki Kabushiki Kaisha, Japan

[21] Appl. No.: 477,434

[22] Filed: Feb. 9, 1990

Related U.S. Application Data

[62] Division of Ser. No. 259,801, Oct. 19, 1988, abandoned.

[30] Foreign Application Priority Data

Oct. 22, 1987 [JP] Japan .................. 62-268435

[51] Int. Cl.⁵ .......................... H01L 21/44
[52] U.S. Cl. ................... 437/192; 437/912; 437/944; 437/200; 437/229; 437/39; 437/41; 437/177; 437/924; 148/DIG. 100; 148/DIG. 140
[58] Field of Search ........... 437/912, 924, 944, 200, 437/41, 39, 229, 175, 176, 177; 148/DIG. 141, DIG. 100

[56] References Cited

U.S. PATENT DOCUMENTS

| 4,729,966 | 3/1988 | Koshino et al. | 437/912 |
| 4,735,913 | 4/1988 | Hayes | 437/39 |
| 4,839,304 | 6/1989 | Morikawa | 437/177 |
| 4,849,376 | 7/1989 | Balzan et al. | 437/41 |
| 4,871,419 | 10/1989 | Nakano | 156/643 |
| 4,923,823 | 5/1990 | Kohno | 437/192 |

FOREIGN PATENT DOCUMENTS

| 0108251 | 5/1984 | European Pat. Off. | |
| 0156185 | 10/1985 | European Pat. Off. | |
| 0157052 | 10/1985 | European Pat. Off. | |
| 0262575 | 4/1988 | European Pat. Off. | |
| 61-179551 | 8/1986 | Japan | 357/221 |
| 62-92481 | 4/1987 | Japan | 437/44 |
| 63-132452 | 6/1988 | Japan | |
| WO87/07079 | 11/1987 | PCT Int'l Appl. | |

*Primary Examiner*—Brian E. Hearn
*Assistant Examiner*—Trung Dang
*Attorney, Agent, or Firm*—Leydig, Voit & Mayer

[57] ABSTRACT

A production method of a semiconductor device includes a first process for producing a gate electrode pattern of double layer structure on a semiconductor substrate, which gate electrode pattern comprises a first layer and a second upper heat-resistant material layers each having different etching property, a second process for plating a resist film on the entire surface of the substrate and etching the same to expose the top portion of the second upper heat-resistant material layer, a third process for removing the second upper heat-resistant material layer, a fourth process for hardening the surface of the resist and conducting over development of the resist, and a fifth process for plating a low resistance metal material on the entire surface of the substrate and removing the low resistance metal material together with the resist film by lift-off method, thereby to produce a gate electrode comprising the first lower heat-resistant material layer and a low resistance metal layer which is produced thereon, wherein the low resistance metal layer has a larger width than that of the first lower heat-resistant material layer.

12 Claims, 3 Drawing Sheets

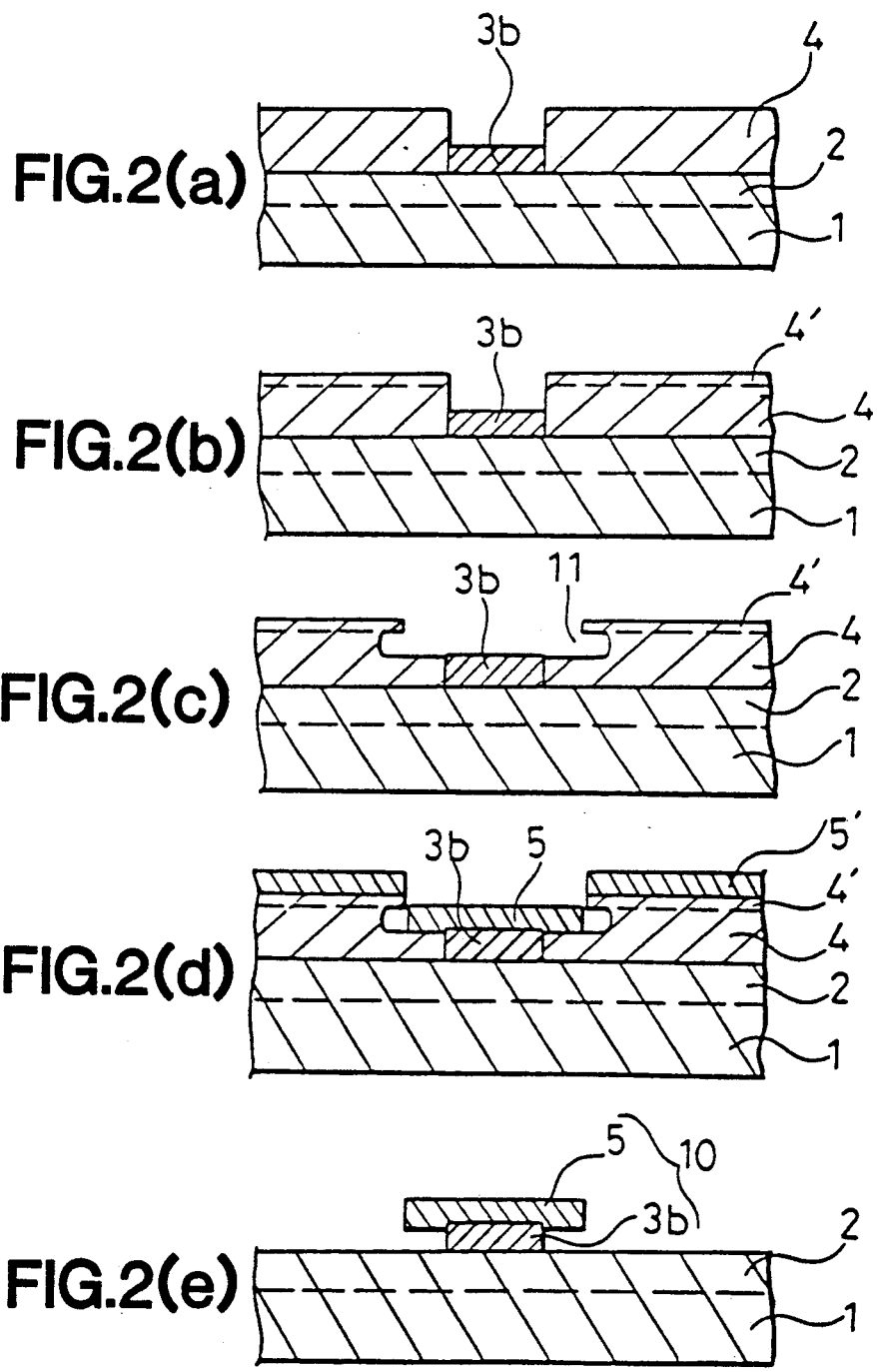

PRODUCTION METHOD FOR A SEMICONDUCTOR DEVICE

This application is a division of application Ser. No. 07/259,801, filed Oct. 19, 1988 now abandoned.

FIELD OF THE INVENTION

The present invention relates to a semiconductor device, and, more particularly, to a production method for a Schottky barrier gate field effect transistor.

BACKGROUND OF THE INVENTION

In a prior art Schottky barrier gate field effect transistor (hereinafter, referred to as MESFET) utilizing a heat-resistant gate, in order to enhance the high frequency response of the MESFET, a low resistance film is disposed on the heat-resistant gate to reduce the gate resistance.

A prior art production process of this kind of FET structure will be described with reference to FIGS. 3(a) to (d).

First of all, as shown in FIG. 3(a), an active layer 2 is produced in a semiconductor substrate, for example, a semi-insulating GaAs substrate 1, and thereafter a heat-resistant material is plated on the semi-insulating GaAs substrate 1 to produce a heat-resistant gate 3. Next, as shown in FIG. 3 (b), resist 4 is deposited on the entire surface of substrate, and a resist pattern is produced on the heat-resistant gate 3 by photolithography. Thereafter, a low resistance metal material 5' is plated on the entire surface of the substrate as shown in FIG. 3 (c), and is lifted off together with the resist pattern 4, thereby producing a low resistance metal layer 5 on the heat-resistant gate 3 (FIG. 3(d)).

In this prior art production process, however, since pattern alignment of resist pattern 4 is required to plate a low resistance metal 5' after the heat-resistant gate 3 is produced, it was very difficult to produce the low resistance metal layer pattern 5 on a heat-resistant gate 3 of sub-micron length with a high degree of control.

SUMMARY OF THE INVENTION

An object of the present invention is to provide a method of producing a semiconductor device capable of producing a low resistance metal layer on a heat-resistant material layer of sub-micron length with a high degree of control.

Another object of the present invention is to provide a semiconductor device produced by such method.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a semiconductor device is produced by forming a gate electrode pattern having a double layer structure comprising an upper and a lower heat-resistant material layer, each having different etching property, on a semiconductor substrate, depositing a resist film on the entire surface of substrate, etching the resist film to expose the top portion of the upper heat-resistant material layer, removing the upper heat-resistant material layer, plating a low resistance metal material on the entire surface of substrate, and depositing a self-aligned low resistance metal layer on the lower heat-resistant material layer. Thus, the controllability of low resistance metal layer which is disposed on a heat-resistant material layer of sub-micron length is enhanced.

According to another aspect of the present invention, a semiconductor device is produced by forming a gate electrode pattern having a double layer structure comprising an upper and a lower heat-resistant material layer, each having different etching property, on a semiconductor substrate, plating resist film on the entire surface of substrate, etching the resist film to expose the top portion of the upper heat-resistant material layer, removing the upper heat-resistant material layer, hardening the surface of the resist film, over-developing the resist film and plating a low resistance metal material on the entire surface of the substrate, removing the low resistance metal material together with the resist film by lift-off method, thereby producing a low resistance metal layer wider than the underlying lower heat-resistant material layer. Thus, the gate resistance is greatly reduced.

BRIEF DESCRIPTION OF THE DRAWINGS

FIGS. 2(a) to (e) are cross-sectional views of a MESFET production method according to another embodiment of the present invention.

DETAILED DESCRIPTION OF THE PREFERRED EMBODIMENTS

Figure 1A:
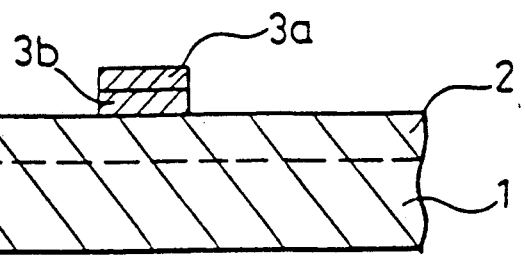
FIGS. 1(a) to 1(f) are cross-sectional views of a MESFET production method according to an embodiment of the present invention.

An embodiment of the present invention will be described in detail with reference to the drawings.

FIGS. 1(a) to 1(f) are cross-sectional views of a MESFET production process according to an embodiment of the present invention. In FIG. 1, reference numeral 1 designates a semi-insulating GaAs substrate, numeral 2 designates an active layer, numerals 3a and 3b designate an upper and a lower heat-resistant material layers comprising a refractory metal silicide, respectively. Reference numeral 4 designates a resist film, numeral 5 designates a low resistance metal layer, and numeral 10 designates a gate electrode.

First of all, as shown in FIG. 1(a), an active layer 2 is produced by ion implanting Si with an injection energy of several tens keV and a dose quantity of $10^{12} \sim 10^{13}$ cm$^{-2}$ in a surface region of a semi-insulating GaAs substrate 1, or by an epitaxial growth method on a surface of a semi-insulating GaAs substrate 1. Next, a lower heat-resistant material layer 3b comprising, for example, tungsten silicide (WSi) is deposited to a thickness of several 1000 Å or less on the entire surface of GaAs substrate 1 by sputtering or a growth method. Next, an upper heat-resistant material layer 3a comprising, for example, titanium tungsten silicide (TiWSi) is deposited to a thickness of 1000 Å to several 1000 Å on the entire surface of GaAs substrate 1 by sputtering or a growth method. Thereafter, the upper and lower heat-resistant material layers 3a and 3b are etched by RIE (Reactive Ion Etching) or ECR (Electron Cyclotoron Resonance) etching on a condition that they are etched at approximately the same speed, thereby to produce a gate electrode pattern.

Figure 1B:
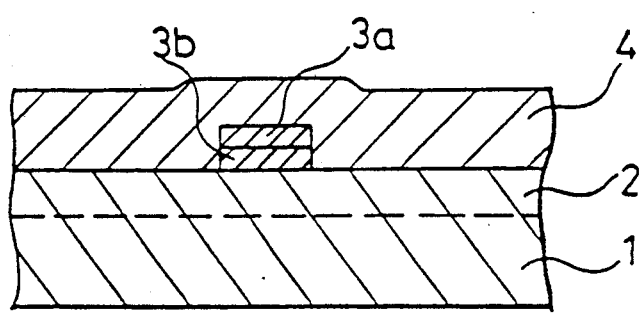

Next, as shown in FIG. 1(b), resist of low viscosity is spin-coated on the entire surface of GaAs substrate 1 to cover the upper and lower heat-resistant material layers 3a and 3b.

Figure 1C:
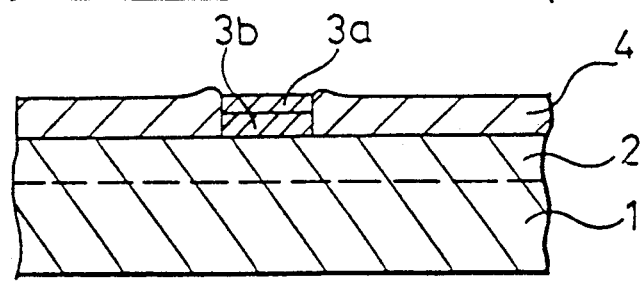

Next, as shown in FIG. 1(c), the resist film 4 is etched by reactive ion etching with a mixture of $CF_4$ and $O_2$, thereby exposing the top portion of the upper heat-resistant material layer 3a.

Figure 1D:
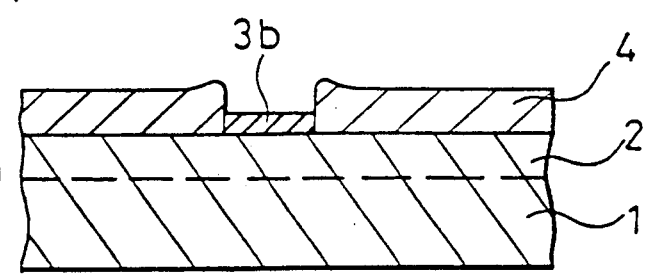

Next, as shown in FIG. 1(d), the exposed upper heat-resistant material layer 3a is selectively etched at a higher rate than that of the lower heat-resistant material layer 3b by RIE or wet etching, thereby leaving the lower heat-resistant material layer 3b.

Figure 1E:
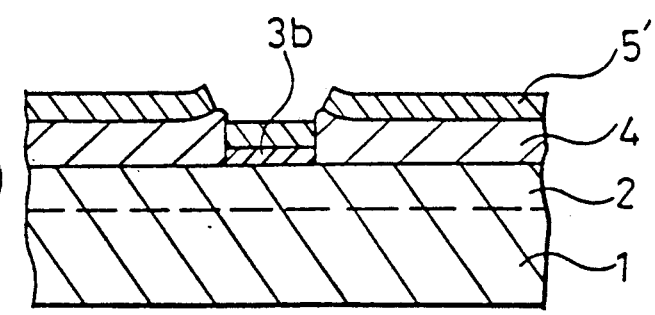

Next, as shown in FIG. 1(e), a low resistance metal material 5' comprising for example, a Ti/Au alloy is vapor deposited to a thickness that is less than the difference between the thickness of resist film 4 and that of lower heat-resistant material layer 3b.

Figure 1F:
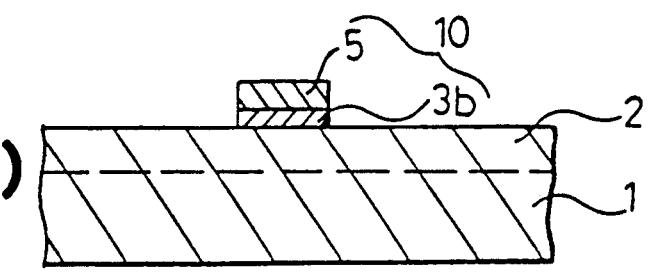
Figure 3A:
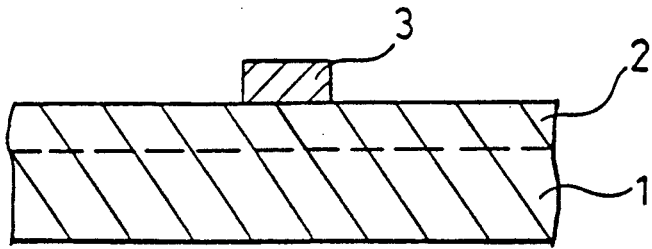
FIGS. 3(a) to 3(d) are cross-sectional views of a MESFET production method according to the prior art.
Figure 3B:
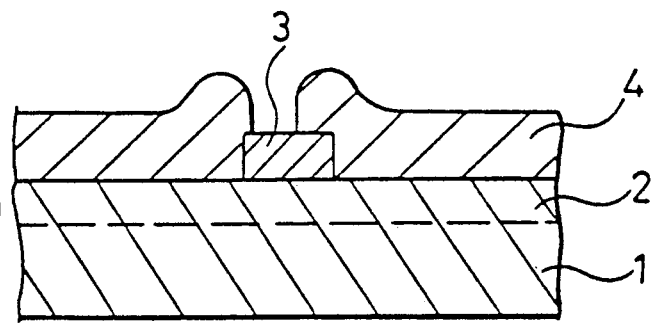
Figure 3C:
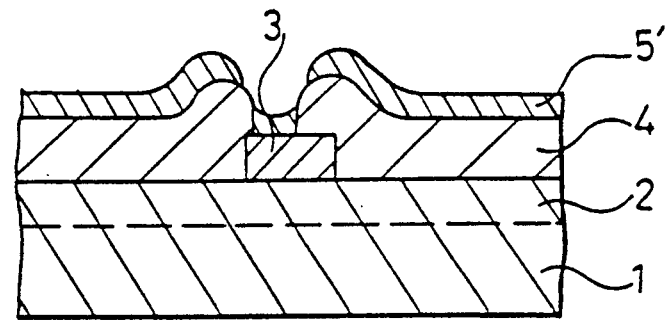
Figure 3D:
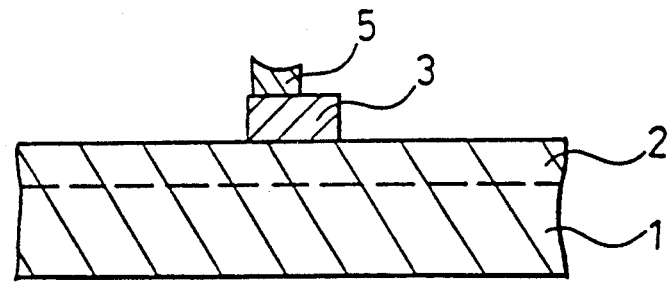

Lastly, as shown in FIG. 1(f), the low resistance metal material film 5' is lifted off together with the resist film 4, thereby producing a gate electrode 10 of double layer structure in which a self aligned low resistance metal layer 5 is produced on the heat-resistant material layer 3b.

In this first embodiment, as shown in FIG. 1, since the low resistance metal layer 5 is self-aligning with the lower heat-resistant material layer 3b, a sub-micron gate pattern comprising a heat-resistant material layer as a first (lower) layer and a low resistance metal layer as a second (upper) layer is produced with a high degree of control. Furthermore, since the low resistance metal layer 5 is produced on the lower heat-resistant material layer 3b, the gate resistance is lowered. The minimum noise figure, which has been 3 dB in the prior art device can be reduced to 1 dB, and the gain, which has been 5 dB in the prior art device, can be enhanced to $12 \sim 13$ dB, thereby resulting in MESFETs having stable high frequency characteristics throughout a whole wafer or lot.

FIGS. 2(a) to 2(e) are cross-sectional views of a MESFET production process according to another embodiment of the present invention. In FIG. 2, the same reference numerals designate the same elements as those shown in FIG. 1. Reference numeral 4' designates a hardened portion of resist, and reference numeral 11 designates an over-developed portion of resist. Unlike the first embodiment, the low resistance metal layer 5 of this second embodiment is wider than the lower heat-resistant material layer 3b.

In producing this second embodiment, the same process steps as shown in FIGS. 1(a) to the step of FIG. 2(a). As shown in FIG. 2(b), the surface of the resist film 4 is hardened by annealing or irradiation with ultraviolet rays, thereby producing a hardened portion of resist 4'.

Next, as shown in FIG. 2(c), the resist film 4 at the upper portion of the heat-resistant material layer 3b is over-developed by an extended development time, thereby producing an over-developed portion of resist 11.

Thereafter, as shown in FIG. 2(d), a low resistance metal material 5' comprising, for example, a Ti/Au alloy is vapor deposited to a film thickness less than the difference between the thickness of resist film 4 and that of lower heat-resistant material layer 3b.

Lastly, as shown in FIG. 2(e), the low resistance material 5' is lifted-off together with the resist film 4, thereby producing a gate electrode 10 having a double layer structure comprising a lower heat-resistant material layer 3b and a low resistance metal layer 5 disposed thereon, wherein the low resistance metal layer 5 is wider than the underlying lower heat-resistant material layer 3b.

In the second embodiment, in addition to the advantages of the first embodiment, the gate resistance can be further reduced because the low resistance metal layer 5 is wider than the gate, thereby resulting in a semiconductor device having a superior high frequency characteristics.

While in the above-illustrated first and second embodiments a gate production method of MESFET is described, the present invention can be also applied to a gate production method of MISFET (MOSFET) with the same effects as described above.

While in the above-illustrated first and second embodiments TiWSi is used for the upper heat-resistant material layer 3a and WSi is used for the lower heat-resistant material layer 3b, other materials can be used for the respective upper and lower layers on the condition that they are different from each other. For example, $WN_x$, W may be used for the upper layer.

As is evident from the foregoing description, according to the present invention, a gate electrode pattern of double layer structure comprising upper and lower heat-resistant material layers, each having different etching properties is produced on a semiconductor substrate, a resist film is deposited on the entire surface of substrate, the resist film is etched to expose the top portion of the upper heat-resistant material layer, the upper heat-resistant material layer is removed, a low resistance metal is deposited on the entire surface of substrate, and the low resistance metal material is lifted off together with the resist film, thereby producing a self-aligning low resistance metal layer on the lower heat-resistant material layer.

According to another aspect of the present invention, a gate electrode pattern having a double layer structure comprising upper and lower heat-resistant material layers, each having different etching properties is produced on a semiconductor substrate, a resist film is deposited on the entire surface of the substrate, the resist film is etched to expose the top portion of the upper heat-resistant material layer, the upper heat-resistant material layer is removed, the surface of the resist film is hardened, the resist film is over-developed and a low resistance metal is deposited on the entire surface of the substrate, the low resistance metal material is lifted off together with the resist film, thereby producing a low resistance metal layer on the lower heat-resistant material layer, which low resistance metal layer is wider than the underlying lower heat-resistance material layer. Accordingly, a gate pattern of sub-micron length can be obtained with a high degree of control, the gate resistance can be reduced, and a semiconductor device having stable high frequency characteristics can be produced.

What is claimed is:

1. A production method for a semiconductor device comprising:
   depositing on a semiconductor substrate a gate electrode pattern having a double layer structure comprising a layer of a first refractory metal silicide and a second layer chosen from the group consisting of refractory metals, refractory metal silicides, and refractory metal nitrides, said first and second layers having different etching properties, said first layer contacting said substrate;

depositing a resist film on said substrate and said gate pattern and etching the film to expose said second layer; and removing said second layer, depositing a low resistance metal on said resist film and first layer, and removing said resist film with the overlying low resistance metal to produce a gate electrode comprising said first layer and an overlying, self-aligned low resistance metal layer.

2. A production method of a semiconductor device as defined in claim 1, comprising depositing said first and second layers by sputtering.

3. A production method of a semiconductor device as defined in claim 1 wherein said first layer comprises tungsten silicide, and said second layer comprises tungsten titanium silicide.

4. A production method of a semiconductor device as defined in claim 2 wherein said first layer comprises tungsten silicide, and said second layer comprises tungsten titanium silicide.

5. A production method of a semiconductor device as defined in claim 1, comprising etching said resist film by reactive ion etching in a mixture of $CF_4$ and $O_2$.

6. A production method for a semiconductor device comprising:

depositing on a semiconductor substrate a gate electrode pattern having a double layer structure comprising a layer of a first refractory metal silicide and a second layer chosen from the group consisting of refractory metals, refractory metal silicides, and refractory metal nitrides, said first and second layers having different etching properties, said first layer contacting said substrate;

depositing a resist film on said substrate and said gate pattern and etching the film to expose said second layer; and removing said second layer;

hardening a portion of said resist film and over developing said resist film; and depositing a low resistance metal on said resist film and first layer and removing said resist film with the overlying low resistance metal to produce a gate electrode comprising said first layer and an overlying, self-aligned low resistance metal layer which has a larger width than that of said first layer.

7. A production method of a semiconductor device as defined in claim 6 comprising depositing said gate electrode pattern of said double layer structure, comprises steps of:

producing said first and second heat resistant material layers by sputtering.

8. A production method of a semiconductor device as defined in claim 6 wherein said first layer comprises tungsten silicide, and said second layer comprises tungsten titanium silicide.

9. A production method of a semiconductor device as defined in claim 7, wherein said first layer comprises tungsten silicide, and said second layer comprises tungsten titanium silicide.

10. A production method of a semiconductor device as defined in claim 6 comprising etching said resist film by reactive ion etching in a mixture of $CF_4$ and $O_2$.

11. A production method of a semiconductor device as defined in claim 6, comprising hardening of said resist film by annealing.

12. A production method of a semiconductor device as defined in claim 6, comprising hardening said resist by irradiation with ultraviolet rays.

* * * * *